US009786544B2

(12) United States Patent
Grisham

(10) Patent No.: US 9,786,544 B2
(45) Date of Patent: Oct. 10, 2017

(54) FLOATING BODY MEMORY CELL APPARATUS AND METHODS

(71) Applicant: Micron Technology, Inc., Boise, ID (US)

(72) Inventor: Paul Grisham, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/456,870

(22) Filed: Aug. 11, 2014

(65) Prior Publication Data

US 2014/0349457 A1    Nov. 27, 2014

Related U.S. Application Data

(62) Division of application No. 12/491,923, filed on Jun. 25, 2009, now Pat. No. 8,803,213.

(51) Int. Cl.
*H01L 21/762* (2006.01)
*H01L 27/108* (2006.01)
*H01L 29/78* (2006.01)
*H01L 29/66* (2006.01)

(52) U.S. Cl.
CPC .. *H01L 21/76224* (2013.01); *H01L 21/76232* (2013.01); *H01L 21/76283* (2013.01); *H01L 27/10802* (2013.01); *H01L 27/10844* (2013.01); *H01L 29/66795* (2013.01); *H01L 29/7841* (2013.01)

(58) Field of Classification Search
CPC ......... H01L 21/76224; H01L 29/66795; H01L 27/10844; H01L 21/76232; H01L 21/76283; H01L 27/10802; H01L 29/7841
See application file for complete search history.

(56) References Cited

U.S. PATENT DOCUMENTS

| 7,018,876 | B2   | 3/2006  | Mathew et al.            |
|-----------|------|---------|--------------------------|
| 7,411,823 | B2   | 8/2008  | Forbes et al.            |
| 7,470,598 | B2 * | 12/2008 | Lee .......... H01L 21/2007 257/E21.122 |
| 8,803,213 | B2   | 8/2014  | Grisham                  |
| 2006/0284210 | A1 | 12/2006 | Mathew et al.          |
| 2007/0200157 | A1* | 8/2007 | Shino ............ H01L 27/108 257/296 |
| 2007/0215916 | A1 | 9/2007  | Minami et al.           |
| 2008/0029827 | A1 | 2/2008  | Ban                      |
| 2008/0090348 | A1 | 4/2008  | Chang et al.             |
| 2008/0149984 | A1 | 6/2008  | Chang et al.             |
| 2008/0150075 | A1 | 6/2008  | Chang                    |

(Continued)

OTHER PUBLICATIONS

U.S. Appl. No. 12/491,923, Restriction Requirement mailed Jun. 1, 2010, 2 pages.

(Continued)

*Primary Examiner* — John P Dulka
(74) *Attorney, Agent, or Firm* — Schwegman Lundberg & Woessner, P.A.

(57) ABSTRACT

Some embodiments include apparatus and methods having a base; a memory cell including a body, a source, and a drain; and an insulation material electrically isolating the body, the source, and the drain from the base, where the body is configured to store information. The base and the body include bulk semiconductor material. Additional apparatus and methods are described.

20 Claims, 13 Drawing Sheets

(56) References Cited

U.S. PATENT DOCUMENTS

| | | |
|---|---|---|
| 2008/0157162 A1 | 7/2008 | Doyle et al. |
| 2008/0237780 A1 | 10/2008 | Yamazaki et al. |
| 2008/0283894 A1 | 11/2008 | Fung et al. |
| 2010/0327334 A1 | 12/2010 | Grisham |

OTHER PUBLICATIONS

U.S. Appl. No. 12/491,923, Response filed Jun. 30, 2010 to Restriction Requirement mailed Jun. 1, 2010, 21 pgs.

U.S. Appl. No. 12/491,923 Non-Final Office Action mailed Sep. 17, 2010, 6 pgs.

U.S. Appl. No. 12/491,923, Response filed Dec. 17, 2010 to Non Final Office Action mailed Sep. 17, 2010, 24 pgs.

U.S. Appl. No. 12/491,923, Final Office Action mailed Mar. 21, 2011, 6 pgs.

U.S. Appl. No. 12/491,923, Response filed Jun. 29, 2011 to Final Office Action mailed Mar. 21, 2011, 10 pgs.

U.S. Appl. No. 12/491,923, Advisory Action mailed Jul. 14, 2011, 3 pgs.

U.S. Appl. No. 12/491,923, Non Final Office Action mailed Sep. 26, 2011, 6 pgs.

U.S. Appl. No. 12/491,923, Response filed Dec. 22, 2011 to Non Final Office Action mailed Sep. 26, 2011, 10 pgs.

U.S. Appl. No. 12/491,923, Final Office Action mailed Apr. 12, 2012, 6 pgs.

U.S. Appl. No. 12/491,923, Response filed Jul. 12, 2012 to Final Office Action mailed Apr. 12, 2012, 9 pgs.

U.S. Appl. No. 12/491,923, Non Final Office Action mailed Mar. 15, 2013, 5 pgs.

U.S. Appl. No. 12/491,923, Final Office Action mailed Sep. 20, 2013, 6 pgs.

U.S. Appl. No. 12/491,923, Response filed Dec. 20, 2013 to Final Office Action mailed Sep. 20, 2013, 13 pgs.

U.S. Appl. No. 12/491,923, Advisory Action mailed Jan. 10, 2014, 3 pgs.

U.S. Appl. No. 12/491,923, Notice of Allowance mailed Mar. 31, 2014, 5 pgs.

\* cited by examiner

FLOATING BODY MEMORY CELL APPARATUS AND METHODS

PRIORITY APPLICATION

This application is a divisional of U.S. application Ser. No. 12/491,923, filed Jun. 25, 2009, which is incorporated herein by reference in its entirety.

BACKGROUND

Various types of memory devices are used in many electronic products to store data and other information. A nonvolatile memory device, such as flash memory device, stores information in the form of an amount of electrons in isolated gates of transistors of memory cells of the device. A volatile memory device, such as a dynamic-random-access memory (DRAM) device, stores information in the form of charge in capacitors of memory cells of the device. Some DRAM devices have memory cells without memory capacitors. Thus, they can have a higher cell density than DRAM devices with memory capacitors. In some cases, however, fabricating DRAM devices without memory capacitors can be difficult, expensive, or both.

DETAILED DESCRIPTION

Figure 1:
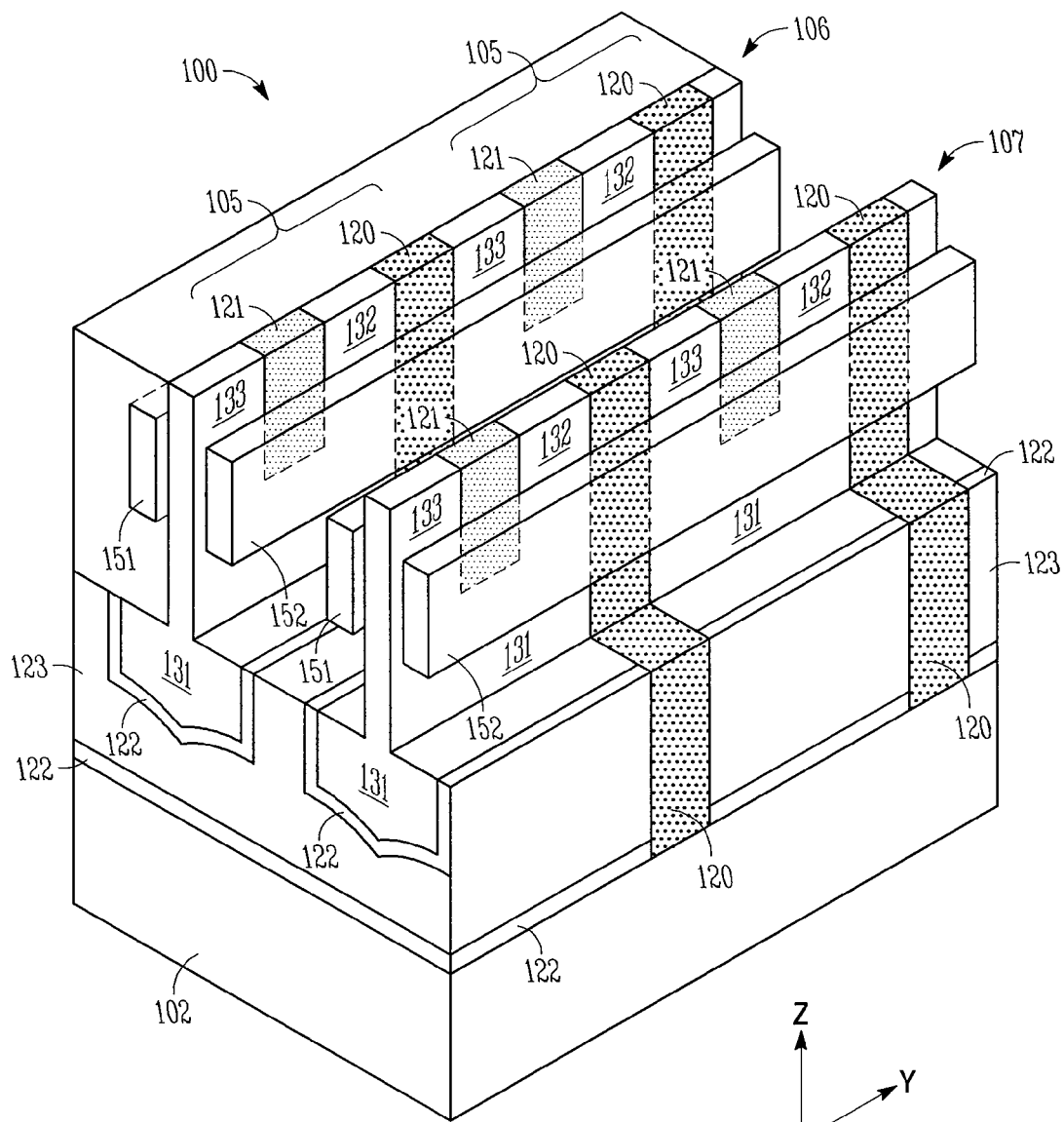
FIG. 1 shows a 3D diagram of a portion of a memory device, according to an embodiment of the invention.

FIG. 1 shows a partial 3D diagram of a memory device 100, according to an embodiment of the invention. Memory device 100 includes memory cells 105 arranged in rows 106 and 107 in an x-direction. Each memory cell 105 includes a body 131, a source 132, and a drain 133 that are electrically isolated from a base 102 by a combination of insulation materials 122 and 123. As shown in FIG. 1, source 132 and drain 133 are arranged in a y-direction. Body 131 is directly coupled to source 132 and drain 133. Body 131 is also arranged vertically with base 102 and source 132 and drain 133 in a z-direction, which is perpendicular to the x-direction and the y-direction. Body 131 is located between base 102 and source 132, and drain 133.

Base 102, body 131, source 132, and drain 133 include the same bulk semiconductor material. The bulk semiconductor material can include single crystalline silicon. Base 102, body 131, source 132, and drain 133 can be formed directly from the same single crystalline silicon wafer in which the wafer includes no insulator layer in it at the time body 131, source 132, and drain 133 are formed.

Memory device 100 also includes insulation material 120 between two memory cells 105 in the same row to electrically isolate two adjacent memory cells 105 from each other. Each memory cell 105 includes an insulation material 121 between source 132 and drain 133 to electrically isolate source 132 and drain 133 from each other.

Each memory cell 105 also include gates 151 and 152 on both side of body 131, source 132, and drain 133. The memory cells in the same row 106 or 107 share a pair of gates 151 and 152. FIG. 1 shows a single gate 151 in the same row to indicate that the gates on one side of memory cells 105 in the same row can be electrically coupled together. Likewise, FIG. 1 shows a single gate 152 in the same row to indicate that the gates on another side of memory cells 105 in the same row can be electrically coupled together.

To help focus on the embodiments herein, FIG. 1 shows only four memory cells 105 in two rows. Memory device 100 can include many rows and each row can include many cells. Further, for simplicity, FIG. 1 omits additional features of memory device 100, such as conductive lines (e.g., source lines and data/sense lines) coupled to source 132 and drain 133, and conductive lines (e.g., access lines, for example, word lines) coupled to gates 151 and 152. The additional features also include control circuitry, decoder circuitry, sensing circuitry, and voltage circuitry to provide various voltages to memory devices, and other features of a memory device.

Each memory cell 105 can store information in body 131. Body 131 can be configured such that when appropriate voltages are applied to gates 151 and 152 and to source and drains 132 and 133, extra holes can accumulate in body 131 to represent information store in memory cell 105. The value (e.g., logic 1 or logic 0) of the information stored in each memory cell 105 depend on the number of holes in body 131. For example, a first number of holes in body 131 may represent information of a first value (e.g., logic 1) and a second number, less than the first number of holes in body 131 may represent information of a second value (e.g., logic 0).

In operation, various voltages can be applied to gates 151 and 152 and source and drains 132 and 133 to selectively store information with a specific value into memory cells 105 or to selectively retrieve stored information from memory cells 105. For example, to store information with logic 1 into a selected memory cell 105, a positive voltage can be applied to gate 151 and a negative voltage can be applied to gate 152. A positive voltage can be applied to drain 133 and a ground potential can be applied to source 132 of the selected memory cell 105. Under these voltage conditions, electrons may accelerate from source 132 to drain, via at least a portion of body 131, and collide with semiconductor atoms, creating a number of extra holes. The extra holes may accumulate at body 131 to represent logic 1 of the information. With appropriate voltage (e.g., negative voltage) at gate 152 and appropriate voltage (e.g., ground potential) at source 131, the extra holes at body 131 can be maintained to retain the value (e.g., logic 1) of the information stored therein. In another example, to store information with logic 0, various voltages can be applied to gates 151 and 152 and source 132 and drain 133 of the selected memory cell 105 to reduce the number of holes or the number of extra holes in body 131 of the selected memory cell 105.

To retrieve the information from a selected memory cell 105, a positive voltage can be applied to gate 152. Then, a signal (e.g., voltage or current signal) from drain 133 of the selected memory cell 105 can be measured (e.g., in a sensing operation). The value of the measured signal corresponds to the value of information stored in the selected memory cell 105. For example, when stored information is retrieved, information with a first value (e.g., logic 1) may result in a first signal value, and information with a second value (e.g., logic 0) may result in a second signal value.

Memory device 200 can include a volatile memory device, e.g., a DRAM device. Thus, memory device 200 may frequently perform an operation (e.g., refresh operation) to retain the value of information stored in body 131.

Figure 2:
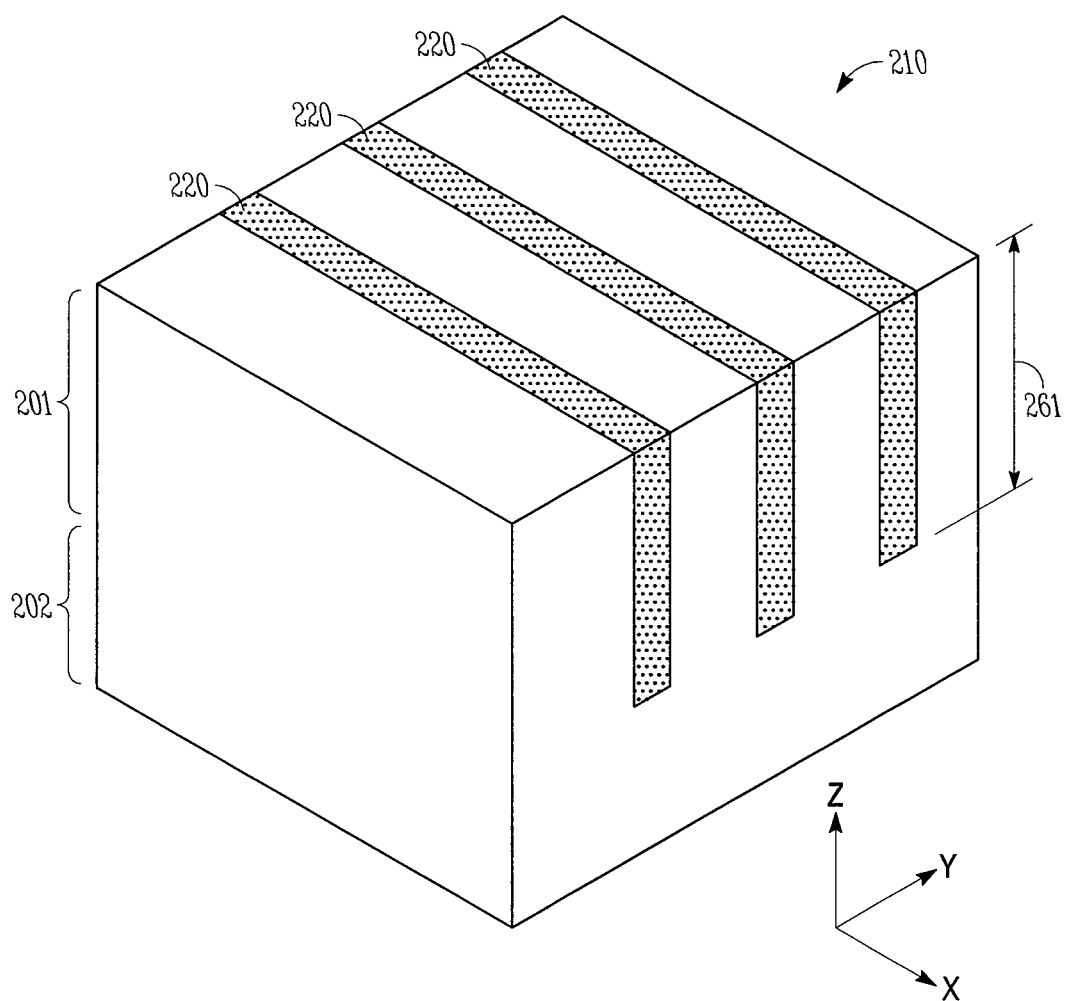
FIG. 2 through FIG. 13 show various processes of forming a memory device, according to an embodiment of the invention.

FIG. 2 through FIG. 13 show various processes of forming a memory device 200, according to an embodiment of the invention. FIG. 2 shows memory device 200 including a material 210 having portions 201 and 202 of the same material, e.g., single crystalline silicon. Both portions 201 and 202 can be a part of a semiconductor wafer or can constitute the entire semiconductor wafer.

As shown in FIG. 2, isolation structures 220 with lengths extending in an x-direction have been formed in material 210. FIG. 2 also shows a y-direction perpendicular to the x-direction and a z-direction perpendicular to the x-direction and the y-direction. Forming isolation structures 220 can include forming trenches with a dimension (e.g., depth) 261 in the z-direction and lengths extending in the x-direction, and then filling the trenches with an insulation material. An example material for isolation structures 220 includes an oxide of silicon, such as silicon dioxide.

Figure 3:
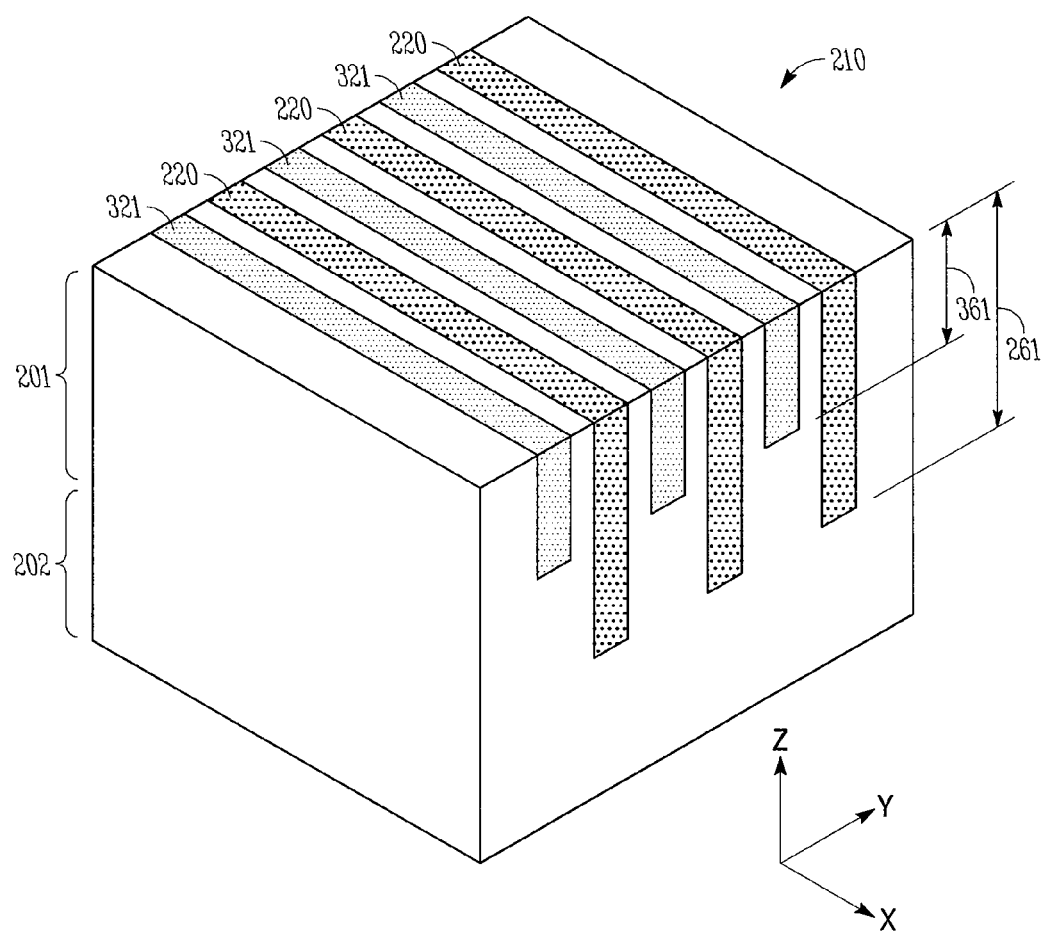

FIG. 3 shows memory device 200 after additional isolation structures 321 have been formed in material 210. Forming isolation structures 321 can include forming trenches with a dimension 361 (e.g., depth in the z-direction) less than dimension 261 and lengths extending in the x-direction, and then filling the trenches with an insulation material. Isolation structures 321 and 220 can have the same material or different materials. An example material for isolation structures 321 includes an oxide of silicon, such as silicon dioxide.

Figure 4:
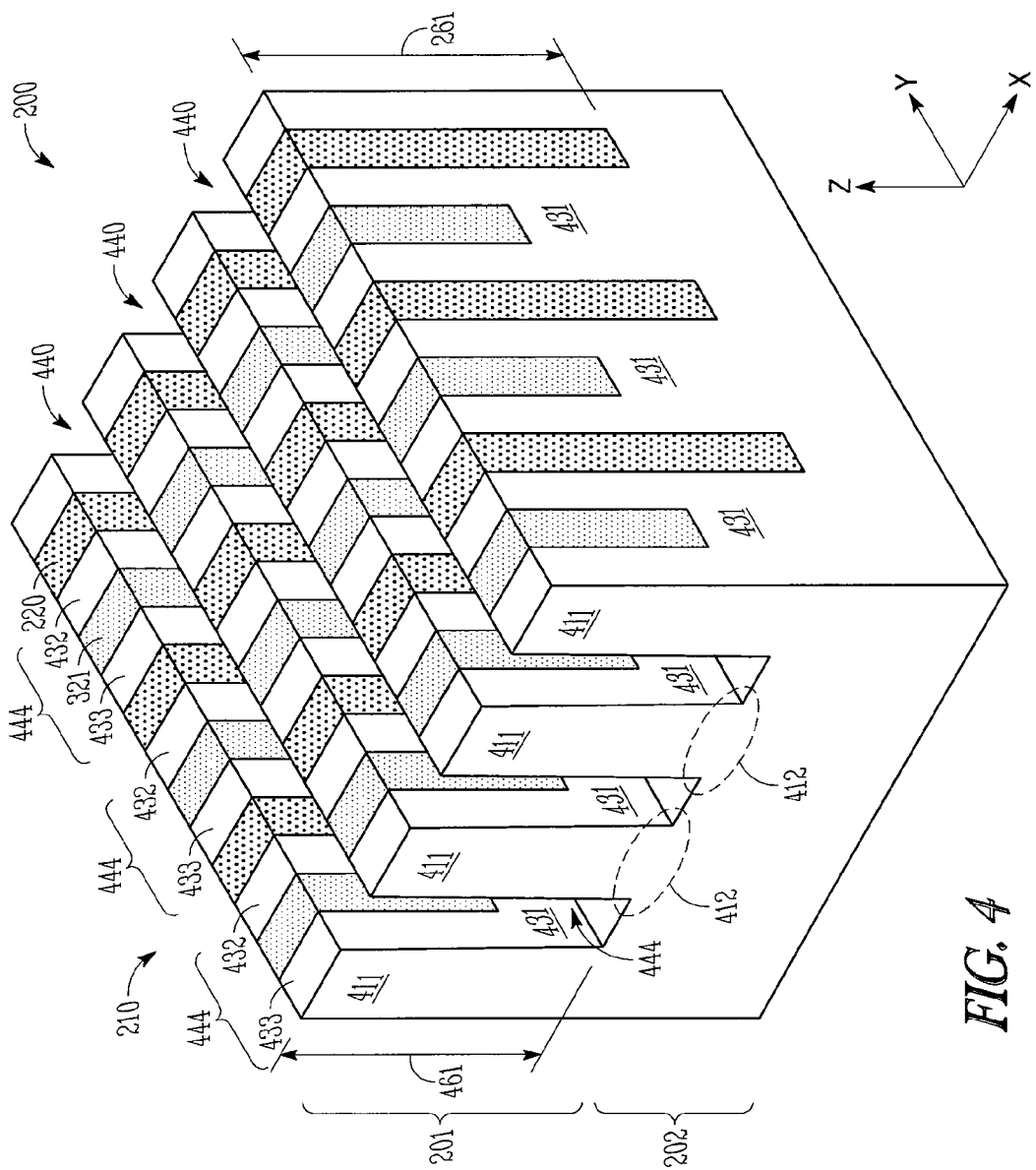

FIG. 4 shows memory device 200 after trenches 440 with lengths extending in the y-direction have been formed. Trenches 440 have a dimension (e.g., depth) 461 in the z-direction that is less than dimension 261 of isolation structures 220 but greater than dimension 361 of isolation structure 321. Forming trenches 440 can include performing an anisotropic etching process to remove a portion of material 210, a portion of isolation structure 220, and a portion of isolation structure 321.

As show in FIG. 4, pillars 444 in portion 201 of material 210 are produced as a result of forming trenches 440. Each pillar 444 is attached to and protruding from portion 202 of material 210 in the z-direction. Each of pillars 444 includes pillar portions 411 and 412 and can be further processed to form part of a memory cell of memory device 200, as described in details below. For example, as shown in FIG. 4, each pillar portion 411 includes regions 431, 432, and 433 that can respectively form a body, a source, and a drain of a memory cell of memory device 200. Regions 432 and 433 can be doped with impurities (e.g., p-type or n-type impurities) to form the source and drain of the memory cell.

Figure 5:
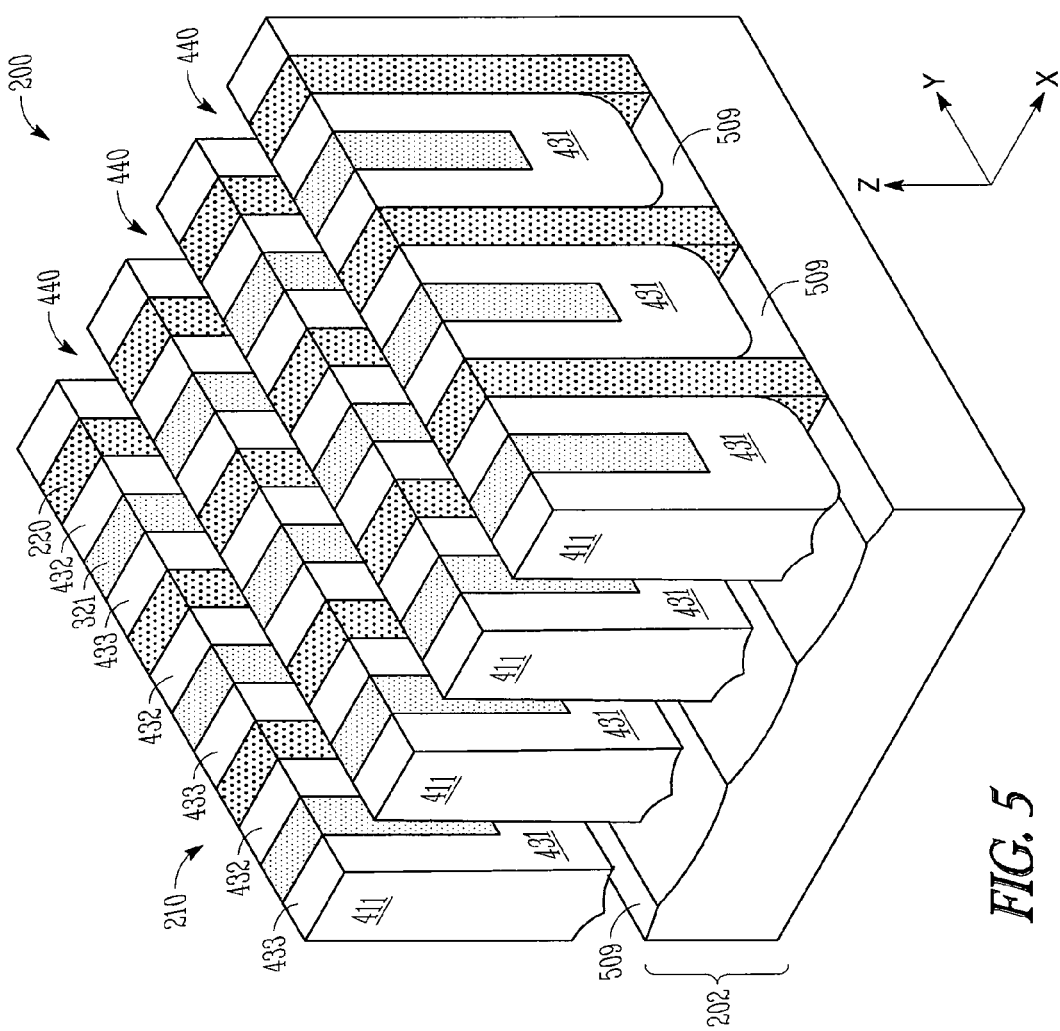

FIG. 5 shows memory device 200 after pillar portion 412 of each of pillars 444 of FIG. 4 has been removed. Removing pillar portion 412 of each of pillars 444 can include performing an isotropic etching process, such that an empty space 509 (e.g., occupied by air) is formed after pillar portion 412 of each of pillars 444 is removed. The remaining pillar portion 411 of each pillar is electrically isolated from portion 202 of material 210 (or "floating" over portion 202) by space 509. Trenches 440 are connected to each other at their lower portions (e.g., their bottoms) by space 509. Additional processes in forming memory device 200 will fill space 509 with an insulation material, as described in detail below. In FIG. 5, portion 202 of material 210 can be considered as a base of memory device 200. As shown in FIG. 4, regions 432 and 433 in each pillar portion 411 are electrically isolated from each other by one of isolation structures 321 that are formed before the removal of pillar portion 412 of each of pillars 444. Thus, regions (e.g., 431, 432, and 433) for forming a body, a source, and a drain of a memory cell of memory device 200 can be formed before pillar portion 412 of each of pillars 444 is removed.

Figure 6:
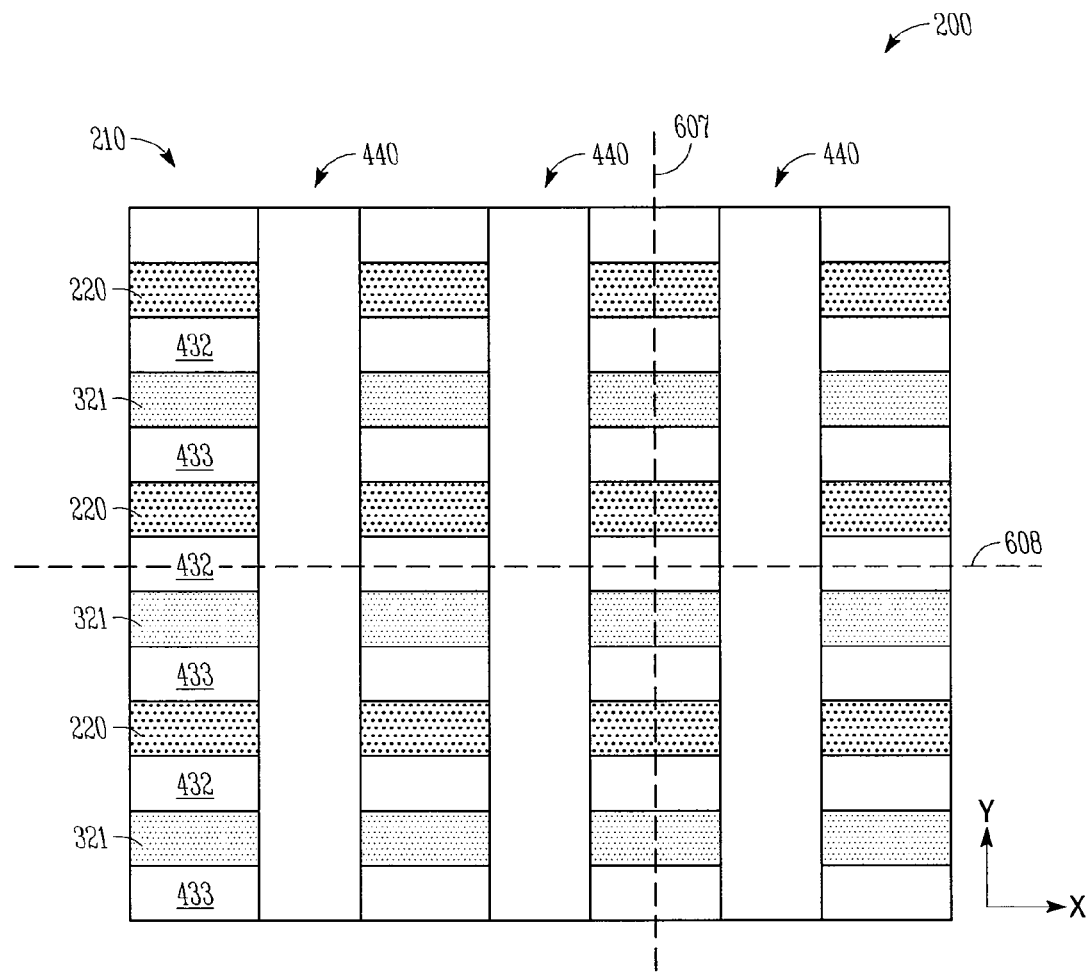
Figure 7:
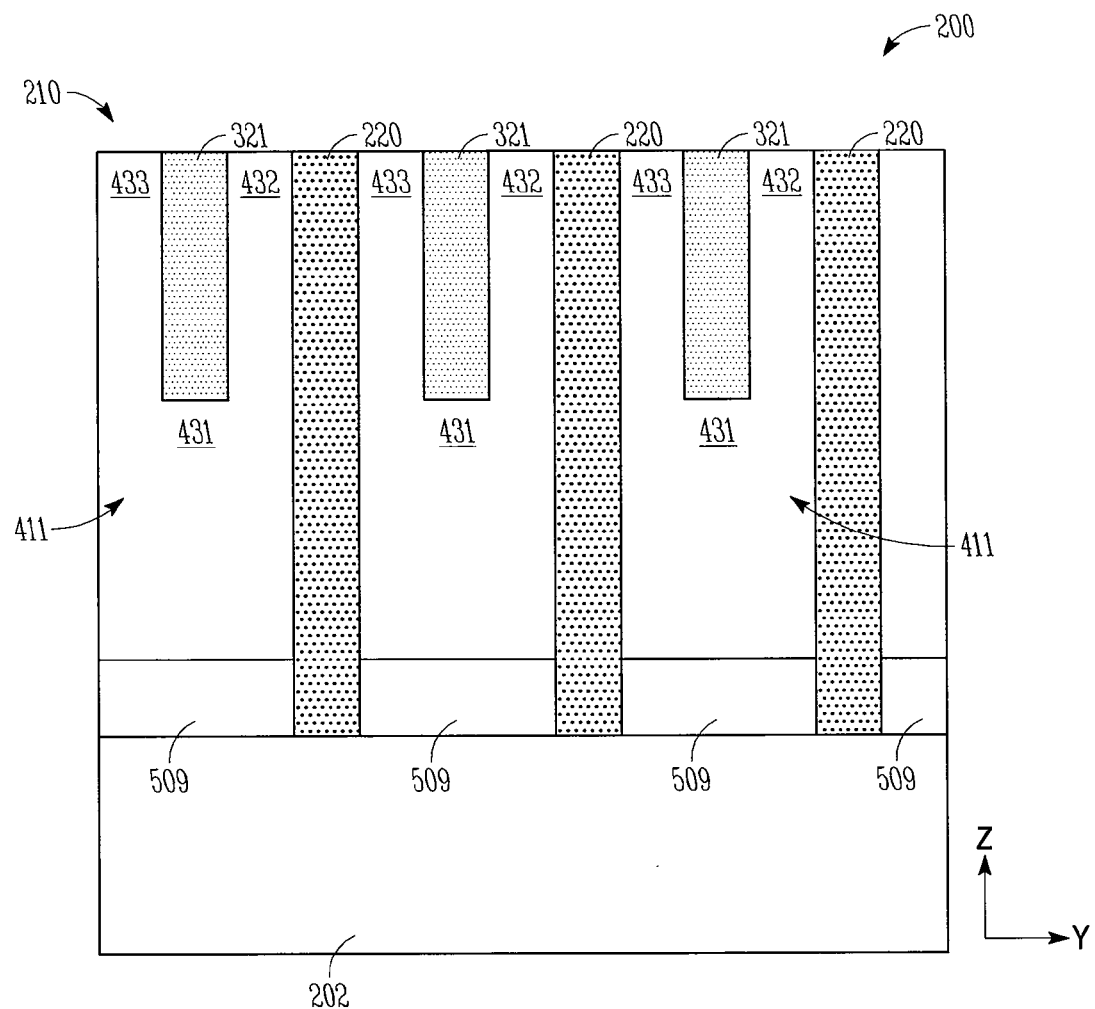

FIG. 6 shows a top view of memory device 200 of FIG. 5. In FIG. 6, line 607 indicates a cross sectional line in the y-direction. A cross section view of memory device 200 along line 607 is shown in FIG. 7. Line 608 indicates a cross sectional line in the x-direction. A cross section view of memory device 200 along line 608 is shown in FIG. 8.

FIG. 7 shows a cross section of memory device 200 along line 607 of FIG. 6. As shown in FIG. 7, after portion 412 (shown in FIG. 4) of each pillar 444 is removed, pillar portion 411 of each pillar 444 is isolated from portion 202 of material 210 by space 509 is adjacent to isolation structures 220.

Figure 8:
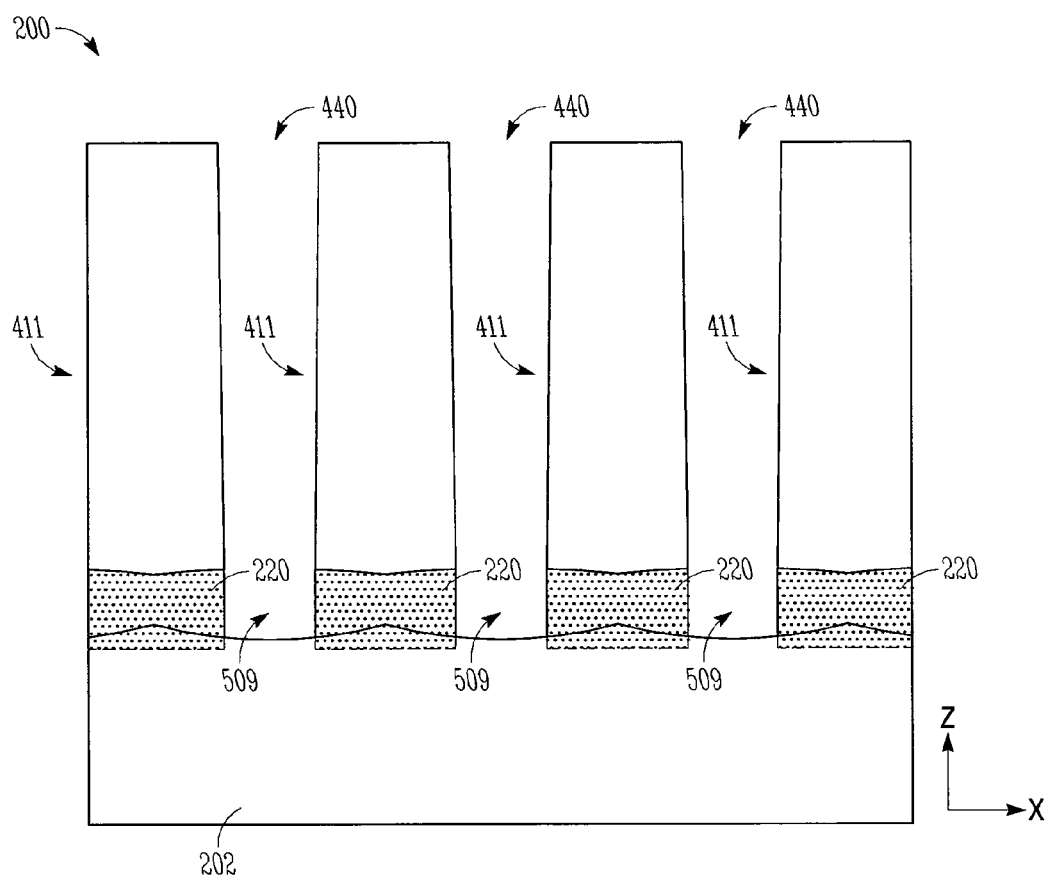

FIG. 8 shows a cross section of memory device 200 along line 608 of FIG. 6. FIG. 8 shows trenches 440 between pillar portions 411, which are isolated from portion 202 of material 210 by space 509. Isolation structures 220 are behind pillar portion 411 of each pillar 444. However, since space 509 is empty, a portion (e.g., bottom portion) of isolation structures 220 attached to portion 202 can be seen through space 509.

Figure 9:
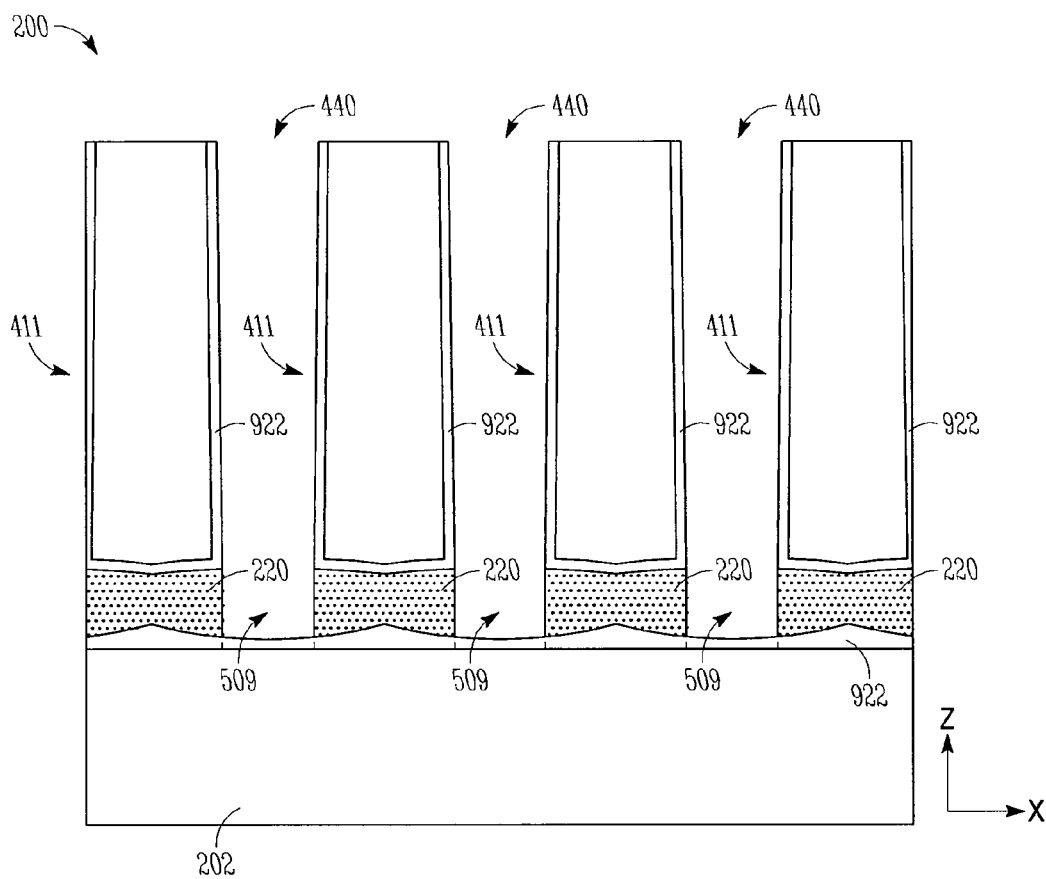

FIG. 9 shows memory device 200 after an insulation material 922 has been formed. Forming material 922 can include oxidizing at least a part (e.g., an outer part) of pillar portion 411 and at least a part (e.g., an upper part) of portion 202 of material 210. Thus, insulation material 922 can include an oxide of silicon, resulting from oxidation of the material (e.g., bulk silicon) of at least a part of pillar portion 411 and at least a part of portion 202 of material 210.

Figure 10:
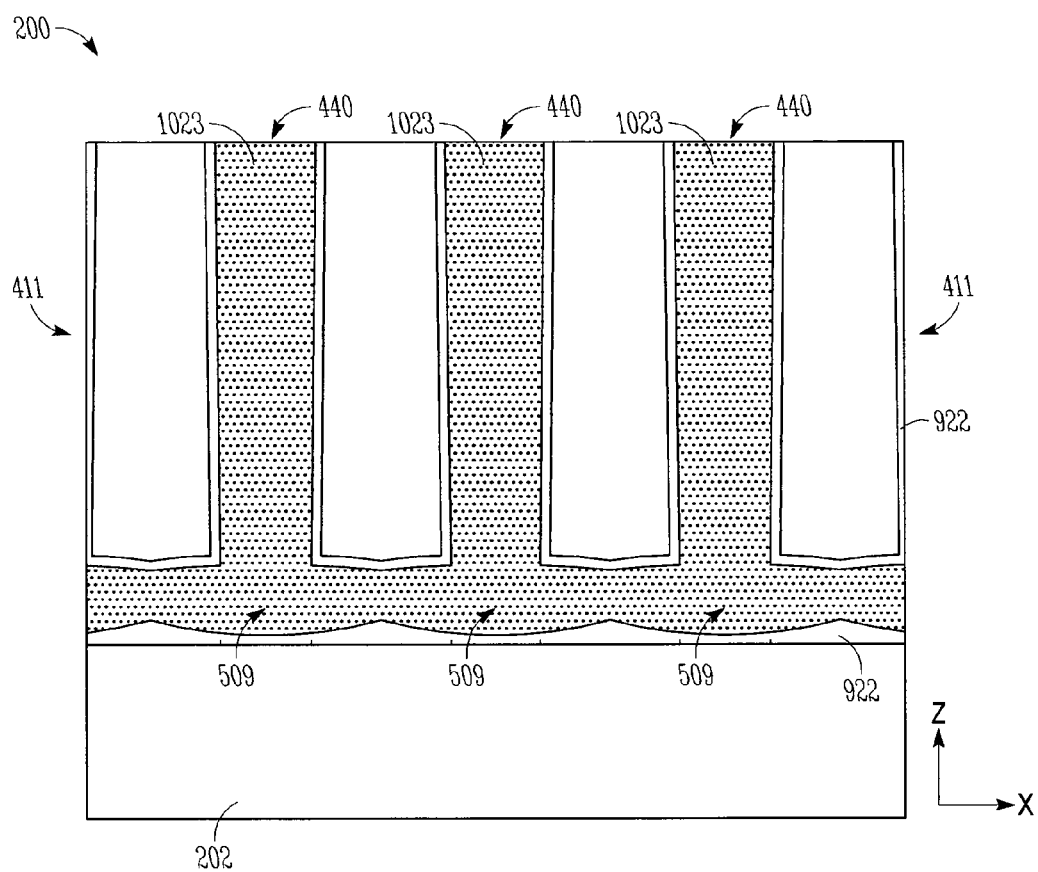

FIG. 10 shows memory device 200 after a material 1023 has been formed. Forming material 1023 can include filling trenches 440 and space 509 with an insulation material, for example, glass such as silicate glass. Examples of silicate glass include Borophosphosilicate glass (BPSG) and Phosphosilicate glass (PSG). Other insulation materials can be used. Up through the process represented by FIG. 10, at least a part of pillar portion 411 is surrounded with insulation material 922 and insulation material 1023.

Figure 11:
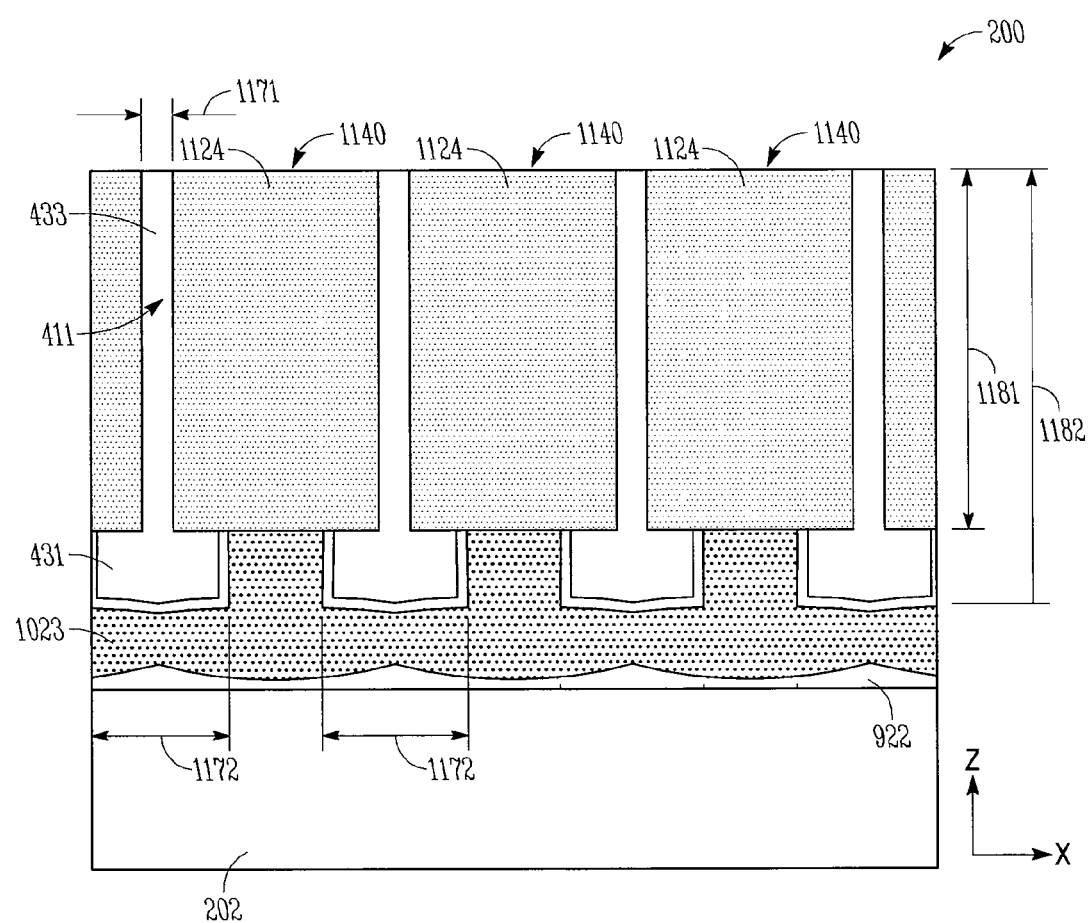

FIG. 11 shows memory device 200 after a material 1124 has been formed. Forming material 1124 can include forming trenches 1140 in the y-direction by removing a portion of material 1023 in trenches 440, a portion of material 922, and portions of material on both sides (sides in the x-direction) of pillar portion 411. As shown in FIG. 11, pillar portion 411 has dimension (e.g., entire length) 1182 in the z-direction. Trenches 1140 are formed to a dimension (e.g., depth) 1181 in the z-direction, which is less than dimension 1182. Thus, forming trenches 1140 can include removing portions of material on both sides, in the x-direction, of pillar portion 411 but less the entire material of pillar portion 411 in the z-direction.

After trenches 1140 are formed, they can be filled with material 1124, which includes insulation material. As shown in FIG. 11, after portions of material on both sides of pillar portion 411 is removed, pillar portion 411 has a dimension 1171 in the x-direction at drain 433 (also shown in FIG. 5) and a dimension 1172 in the x-direction at body 431 (also shown in FIG. 5). Dimension 1172 is greater than dimension 1171.

Figure 12:
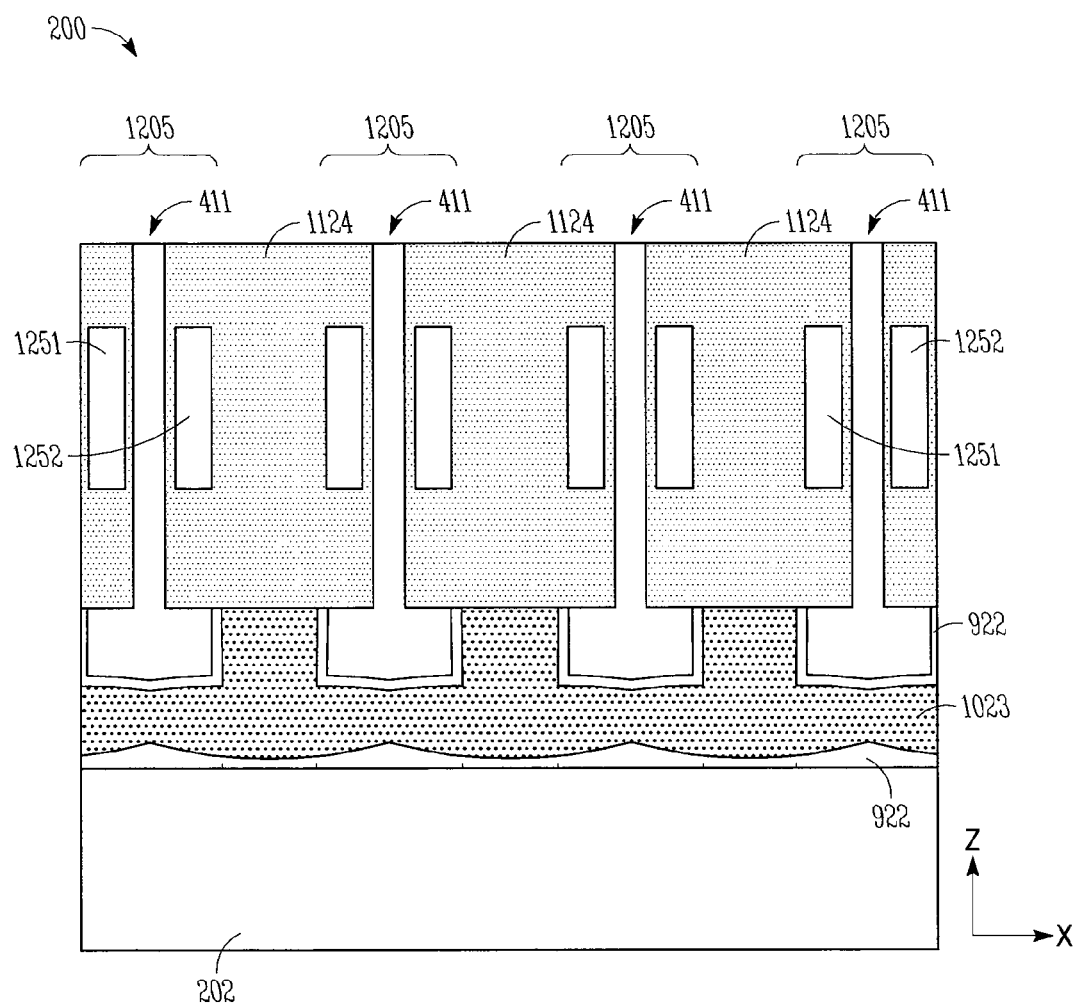

FIG. 12 shows memory device 200 after gates 1251 and 1252 have been formed. Gates 1251 and 1252 can be formed by, for example, removing a portion of material 1124, filling the removed portion of material 1124 with a conductive material for gates 1251 and 1252, and then perform one or more additional processes (e.g., patterning or etching) to complete the structures of gates 1251 and 1252, as shown in FIG. 12. Gates 1251 and 1252 are parts of memory cells

1205 of memory device 200. Memory cells 1205 can correspond to memory cells 105 of FIG. 1. As shown in FIG. 12, each memory cell 1205 includes one pillar portion 411, one gate 1251, and one gate 1252. Other processes known to those skilled in the art can be performed to complete additional features of a memory device, such as memory device 200. The additional features can includes conductive lines (e.g., bit lines, source lines, and word lines) associated with memory cells 1205.

Figure 13:
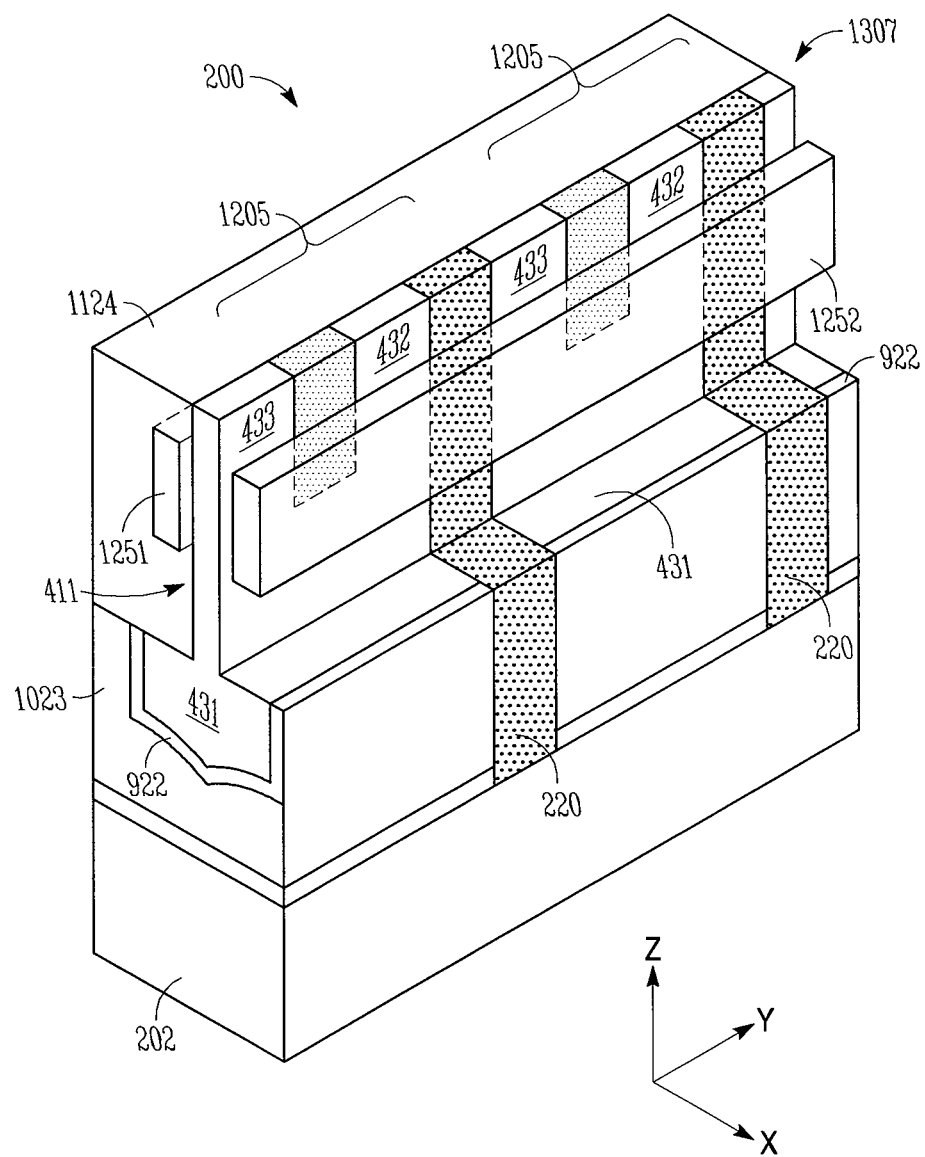

FIG. 13 shows a partial 3D diagram of memory device 200. To help focus on the embodiments herein, FIG. 13 shows only one row 1307 of memory cells 1205. Memory device 200 includes many rows of memory cells and each row can include many cells, similar to that of row 1307. As shown in FIG. 13, each memory cell 1205 includes source 432, drain 433, and body 431 directly coupled to source 432 and drain 433. Body 431 is also arranged vertically with base 402 and source 432 and drain 433 in the z-direction.

Since a part of memory device 200, such as body 431, source 432, and drain 433 of each memory cell 1205 and portion 202 (e.g., base of memory device 200) are formed from the same semiconductor material (e.g., bulk silicon), the cost of fabricating memory device 200 can be lower than that of forming similar conventional memory devices. Further, some conventional techniques may form epitaxial silicon directly on bulk silicon of a silicon substrate or directly on an insulator layer in a silicon substrate. Then, the conventional techniques may form parts of memory cells of a memory device from the epitaxial silicon, which is different from the bulk silicon of the substrate. In some cases, crystalline defects may occur while forming the epitaxial silicon, leading to defects associated with forming the conventional memory devices. In device 200, however, forming parts, such as body 431, source 432, and drain 43 of each memory cell 1205 and portion 202, from the same semiconductor material may avoid defects related to fabricating memory device 200.

One or more embodiments described herein include apparatus and methods having a base; a memory cell including a body, a source, and a drain; and an insulation material electrically isolating the body, the source, and the drain from the base, where the body is configured to store information. The base and the body include bulk semiconductor material. Other embodiments, including additional methods and devices can be implemented using the methods described above with reference to FIG. 1 through FIG. 13.

The illustrations of apparatus such as memory devices 100 and 200 are intended to provide a general understanding of the structure of various embodiments and not a complete description of all the elements and features of the apparatus that might make use of the structures described herein.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. A method comprising:
   forming pillars from a first portion of a semiconductor material, each of the pillars including a first pillar portion and a second pillar portion, the second pillar portion being between the first pillar portion and a second portion of the semiconductor material;
   removing the second pillar portion of each of the pillars after the pillars are formed to electrically isolate the first pillar portion of each of the pillars from the second portion of the semiconductor material; and
   forming memory cells that include at least the first pillar portion of each of the pillars.

2. The method of claim 1, wherein the second pillar portion of each of the pillars and the second portion of the semiconductor material include a same bulk silicon material.

3. The method of claim 1, wherein forming the memory cells includes forming a source in the first pillar portion of the first pillar and forming a drain in the first pillar portion of the first pillar.

4. A method comprising:
   forming pillars from a first portion of a semiconductor material, each of the pillars including a first pillar portion and a second pillar portion, the second pillar portion being between the first pillar portion and a second portion of the semiconductor material;
   removing the second pillar portion of each of the pillars to electrically isolate the first pillar portion of each of the pillars from the second portion of the semiconductor material; and
   forming memory cells that include at least the first pillar portion of each of the pillars, wherein forming the memory cells includes forming a first gate on a first side of the first pillar portion of a first pillar among the pillars and forming a second gate on a second side, opposite from the first side of the first pillar portion of the first pillar.

5. A method comprising:
   forming pillars from a first portion of a semiconductor material, each of the pillars including a first pillar portion and a second pillar portion, the second pillar portion being between the first pillar portion and a second portion of the semiconductor material;
   removing the second pillar portion of each of the pillars to electrically isolate the first pillar portion of each of the pillars from the second portion of the semiconductor material;
   forming memory cells that include at least the first pillar portion of each of the pillars, wherein forming the memory cells includes forming a source in the first pillar portion of the first pillar and forming a drain in the first pillar portion of the first pillar; and forming an insulation material between the source and the drain.

6. A method comprising:

forming isolation structures extending in a first direction in a first portion of a bulk silicon material;

forming trenches extending in a second direction in at least a part of the first portion of the bulk silicon material and in at least a part of the isolation structures to produce pillars in the first portion of the bulk silicon material, the pillars attached to and protruding from a second portion of the bulk silicon material;

removing a selected pillar portion of each of the pillars to electrically isolate a remaining pillar portion of each of the pillars from the second portion of the bulk silicon material; and forming memory cells that include the remaining pillar portion of each of the pillars.

7. The method of claim 6, wherein the isolation structures are formed with a first dimension in a third direction perpendicular to the first and second directions, and the trenches are formed with a second dimension in the third direction, such that the second dimension is less than the first dimension.

8. The method of claim 6, further comprising:

filling an insulation material into a space resulting from the removing of the selected pillar portion of each of the pillars.

9. The method of claim 6 further comprising:

oxidizing at least a part of the remaining pillar portion each of the pillars after the selected pillar portion is removed and before the filling the insulation material into the space.

10. The method of claim 6, wherein forming the memory cells includes forming a first region in each of the pillars to form a source of a memory cell and forming second region in each of the pillars to form a drain of a memory cell before the selected pillar portion of each of the pillars is removed.

11. The method of claim 10, wherein forming the memory cells includes forming gates extending in the second direction.

12. A method comprising:

forming first isolation structures extending in a first direction in a first portion of a bulk silicon material;

forming second isolation structures extending in the first direction in the first portion of the bulk silicon material, such that each of the second isolation structures is between two of the first isolation structures and such that each of the first isolation structures is formed to a first depth the first portion of the bulk silicon material and each of the second isolation structures is formed to a second depth the first portion of the bulk silicon material, wherein the first depth is greater than the second depth;

forming trenches, extending in a second direction in the bulk silicon material perpendicular to the first and second isolation structures to produce pillars in the first portion of the bulk silicon material, the pillars attached to and protruding from a second portion of the bulk silicon material;

removing a selected pillar portion of each of the pillars to electrically isolate a remaining pillar portion of each of the pillars from the second portion of the bulk silicon material;

surrounding at least a part of the remaining pillar portion each of the pillars with an insulation material; and forming memory cells that include the remaining pillar portion of each of the pillars.

13. The method of claim 12, further comprising:

oxidizing an outer portion of the part of the remaining pillar portion each of the pillars before surrounding the part of the remaining pillar portion of each of the pillars with the insulation material.

14. The method of claim 13, wherein surrounding at least the part of the remaining pillar portion of each of the pillars with the insulation material includes filling the insulation material into the trenches and into a space where the selected pillar portion of each of the pillars is removed.

15. The method of claim 12, wherein removing the selected pillar portion of each of the pillars includes performing an etching process to remove the selected pillar portion of each of the pillars.

16. The method of claim 15, wherein the etching process includes an isotropic etching process.

17. The method of claim 12, wherein insulation material includes include an oxide of silicon.

18. The method of claim 12, further comprising:

removing material from both sides in the second direction of the remaining pillar portion of each of the pillars.

19. The method of claim 18, further comprising:

filling an additional insulation material into a space resulting from the removing of the material from both sides of the remaining pillar portion of each of the pillars.

20. The method of claim 19, wherein forming the memory cells includes:

forming a first gate on a first side of the remaining pillar portion of each of the pillars; and forming a second gate on a second side opposite from the first side of the remaining pillar portion of each of the pillars.

* * * * *